(12) United States Patent
Matzke et al.

(10) Patent No.: US 6,592,835 B1
(45) Date of Patent: Jul. 15, 2003

(54) SILICA SUBSTRATE OR PORTION FORMED FROM OXIDATION OF MONOCRYSTALLINE SILICON

(75) Inventors: Carolyn M. Matzke, Los Lunas, NM (US); Dennis J. Rieger, Tijeras, NM (US); Robert V. Ellis, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 205 days.

(21) Appl. No.: 09/836,594

(22) Filed: Apr. 16, 2001

(51) Int. Cl.$^7$ ............................................ C01B 33/12
(52) U.S. Cl. ....................... 423/335; 428/446
(58) Field of Search ........................... 423/335; 428/446

(56) References Cited

U.S. PATENT DOCUMENTS

| | | | | |
|---|---|---|---|---|
| 4,471,525 A | * | 9/1984 | Sasaki | 438/431 |
| 4,479,846 A | * | 10/1984 | Smith et al. | 117/43 |
| 4,615,762 A | | 10/1986 | Jastrzebski et al. | 438/412 |
| 4,888,302 A | * | 12/1989 | Ramesh | 117/44 |
| 5,037,514 A | * | 8/1991 | Yamazaki | 438/788 |
| 5,501,893 A | | 3/1996 | Laermer | 428/161 |
| 5,880,041 A | | 3/1999 | Ong | 438/773 |
| 6,066,576 A | | 5/2000 | Thakur | 438/787 |

OTHER PUBLICATIONS

R.J. Zeto, N.O. Korolkoff and S. Marshall, "Pressure Oxidation of Silicon: An Emerging Technology," *Solid State Technology*, pp. 62–69, Jul. 1979.

R.R. Razouk, L.N. Lie and B.E. Deal, "Kinetics of High Pressure Oxidation of Silicon in Pyrogenic Steam," *Journal of the Electrochemical Society: Solid–State Science and Technology*, vol. 128, pp. 2214–2220, Oct. 1981.

L.E. Katz, B.F. Howells, L.P. Adda, T. Thompson and D. Carlson, "High Pressure Oxidation of Silicon by the Pyrogenic or Pumped Water Technique," *Solid State Technology*, pp. 87–93, Dec. 1981.

* cited by examiner

Primary Examiner—Ngoc-Yen Nguyen
(74) Attorney, Agent, or Firm—John P. Hohimer

(57) ABSTRACT

A method is disclosed for forming an inclusion-free silica substrate using a monocrystalline silicon substrate as the starting material and oxidizing the silicon substrate to convert it entirely to silica. The oxidation process is performed from both major surfaces of the silicon substrate using a conventional high-pressure oxidation system. The resulting product is an amorphous silica substrate which is expected to have superior etching characteristics for microfabrication than conventional fused silica substrates. The present invention can also be used to convert only a portion of a monocrystalline silicon substrate to silica by masking the silicon substrate and locally thinning a portion the silicon substrate prior to converting the silicon portion entirely to silica. In this case, the silica formed by oxidizing the thinned portion of the silicon substrate can be used, for example, as a window to provide optical access through the silicon substrate.

15 Claims, 3 Drawing Sheets

SILICA SUBSTRATE OR PORTION FORMED FROM OXIDATION OF MONOCRYSTALLINE SILICON

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to substrate materials for microfabrication, and in particular to the manufacture of an amorphous silica substrate or portion from the oxidation of a monocrystalline silicon substrate or portion.

BACKGROUND OF THE INVENTION

Commercially-available fused silica substrates are being considered for use in the manufacture of fluidic devices with integrated optics. These microfluidic devices require that one or more fluidic channels be formed in the substrate. Micron-sized channels (also termed microchannels) can be formed using conventional integrated circuit (IC) processing techniques such photolithographic masking and plasma etching (e.g. reactive ion etching). However, the presence of inclusions (e.g. voids, defects and microcrystallites) in commercially-available fused silica substrates results in nonuniform etching and the production of etch pits which degrade the quality of the etched channels. Furthermore, crystalline silica substrates (i.e. crystalline quartz) are birefringent, rendering these substrates unsuitable as alternatives for the formation of microfluidic devices wherein optical activation or detection is to be used. What is needed are amorphous silica substrates that are homogeneous and that are substantially free of inclusions. Such amorphous silica substrates can be formed according to the present invention by starting with a monocrystalline silicon substrate and oxidizing the silicon substrate material to convert it to silica (i.e. silicon dioxide).

Additionally, for certain optical applications windows are needed through a silicon substrate which is not transparent to visible light. The present invention provides a solution to this problem by allowing the formation of a transparent silica portion from a monocrystalline silicon portion of a substrate.

SUMMARY OF THE INVENTION

The present invention relates to a method for forming an inclusion-free silica substrate, comprising steps for providing a monocrystalline silicon substrate, and forming the silica substrate from the silicon substrate by heating the silicon substrate to an elevated temperature and contacting both major surfaces of the silicon substrate with an elevated pressure of an oxidizing ambient, thereby thermally oxidizing the entire silicon substrate. The monocrystalline silicon substrate can be, for example, 10–50 microns ($\mu$m) thick. The elevated temperature can be in the range of 700–1200° C., with the elevated pressure generally being in the range of 5–50 atmospheres. When using a commercial high-pressure oxidation system designed for forming gate and field oxides, the elevated temperature can be, for example, 900–1000° C., with the elevated pressure being generally in the range of 10–25 atmospheres. The oxidizing ambient can comprise oxygen, steam (formed from water or from the reaction of hydrogen and oxygen), or both oxygen and steam.

The present invention further relates to an inclusion-free silica substrate formed by the above process. The silica substrate is formed with a thickness that is about twice the thickness of the monocrystalline silicon substrate so that the silica substrate can be, for example, about 20–100 $\mu$m thick.

The present invention also relates to a method for forming a silica substrate that comprises steps for providing a monocrystalline silicon substrate, heating the silicon substrate to an elevated temperature in the range of 700–1200° C., and contacting two major surfaces of the heated silicon substrate with an oxidizing ambient at an elevated pressure in the range of 5–50 atmospheres for sufficient time to convert the entirety of the silicon substrate into silica. The monocrystalline silicon substrate used as a starting material for forming the silica substrate can have a thickness in the range of 10–50 microns, with the resulting silica substrate being about twice as thick. When using a conventional high-pressure oxidation system, the elevated temperature can be in the range of 900–1000° C., and the elevated pressure in the range of 10–25 atmospheres. The oxidizing ambient can comprise oxygen, steam, or a combination thereof.

Finally, the present invention relates to a method for converting at least a portion of a monocrystalline silicon substrate into silica, comprising steps for heating the silicon substrate to an elevated temperature in the range of 700–1200° C., and contacting a pair of opposing surfaces of the monocrystalline silicon portion with an oxidizing ambient at an elevated pressure in the range of 5–50 atmospheres for sufficient time to convert the entire thickness of the monocrystalline silicon portion into silica. The monocrystalline silicon portion can be defined by a step for forming a mask (e.g. comprising silicon nitride) over each major surface of the silicon substrate.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
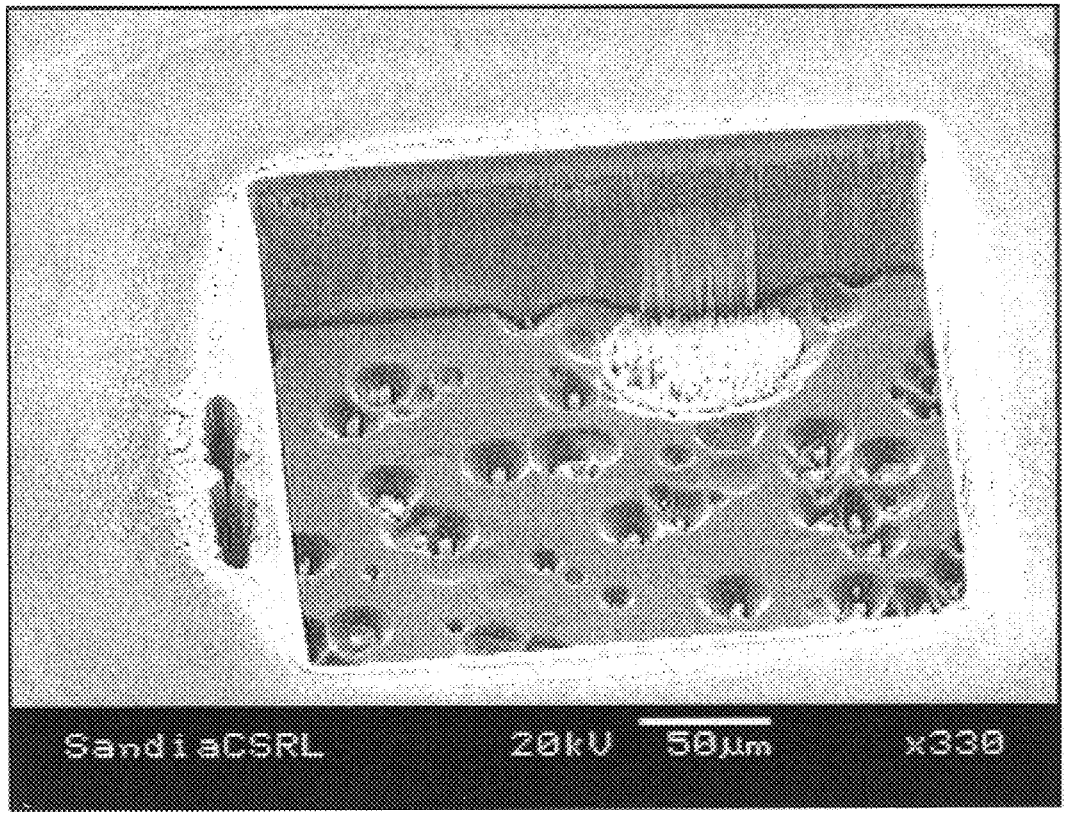
FIG. 1 shows a scanning electron microscope (SEM) image of a conventional fused silica substrate in which a cavity has been plasma etched to illustrate the nonuniform etching that results from the presence of inclusions in the conventional fused silica substrate.

Conventional high-purity fused silica is generally designed to provide excellent optical qualities, but can include inclusions (e.g. due to voids, impurities or microcrystallites) that can affect the etchability of the fused silica. This is shown in FIG. 1 which is an SEM image of a cavity that has been etched downward into a conventional fused silica substrate using an electron cyclotron resonance (ECR) plasma using sulfur hexafluoride ($SF_6$), argon (Ar) and nitrogen ($N_2$) as source gases. The presence of inclusions in the conventional fused silica substrate results a plurality of etch pits being formed in an otherwise flat bottom surface of the etched cavity. These etch pits roughen the bottom surface of the cavity and are undesirable for many types of microfabricated devices that require etched surfaces which are smooth or planar. For example, in microfabricating a microfluidic device comprising one or more microchannels for use in performing electrophoretic or chromatographic separations of different chemical species in solution, smooth surfaces of the microchannels are generally required since interaction of the solution and chemical species with the surfaces or coatings of each microchannel is needed in order to separate the different chemical species to their mass, charge state, or chemical properties.

The present invention overcomes the limitations of the prior art by forming a silica substrate 10 which is substantially free of inclusions. This can be done as schematically illustrated in FIGS. 2A–2D.

Figure 2A:
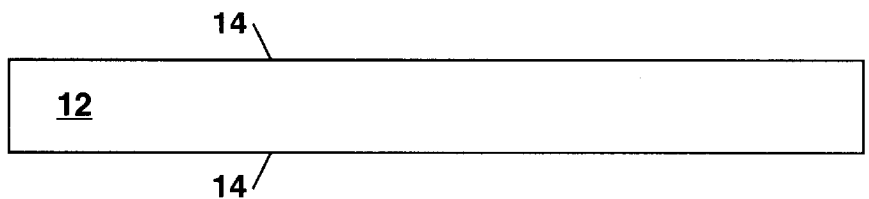
FIGS. 2A–2D schematically illustrate in cross-section view the formation of a silica substrate from a monocrystalline silicon substrate according to the present invention.

In FIG. 2A, a monocrystalline silicon substrate 12 is provided as the starting material for forming the silica substrate 10. The silicon substrate 12 can comprise a conventional monocrystalline silicon wafer known or a portion thereof, with the thickness generally being in the range of 10–50 $\mu$m thick, and with each major surface (i.e. the top and bottom of the substrate 12) generally being polished.

The silicon substrate 12 can be chemically converted into a homogeneous inclusion-free amorphous silica substrate 10 using a high-pressure oxidation process as described hereinafter. The formation of the silica substrate 10 by oxidizing the silicon substrate 12 is expected to eliminate etching irregularities (e.g. etch pits) since the silica substrate 10 can be formed without any inclusions therein.

In order to convert the silicon substrate 12 into the silica substrate 10, a conventional high-pressure oxidation system can be used. Such high pressure oxidation systems are used by the semiconductor IC industry, for example, to form thin gate oxides and field oxides for transistors formed on a silicon substrate. These gate oxides and field oxides, which are limited in spatial extent and which do not extend completely through the silicon substrate, do not show any etch pits when plasma etched. Generally, the gate oxides and field oxides are limited to being on the order of one micron thick or less.

Further details of conventional high-pressure oxidation systems suitable for practice of the present invention can be found in the following articles: R. J. Zeto, et al., "Pressure Oxidation of Silicon: An Emerging Technology," *Solid State Technology*, pp. 62–69, July 1979; R. R. Razouk, et al., "Kinetics of High Pressure Oxidation of Silicon in Pyrogenic Steam," *Journal of the Electrochemical Society: Solid-State Science and Technology*, vol. 128, pp. 2214–2220, October 1981; L. E. Katz, et al., "High Pressure Oxidation of Silicon by the Pyrogenic or Pumped Water Technique," *Solid State Technology*, pp. 87–93, December 1981. High-pressure oxidation systems are currently available from semiconductor equipment manufacturers (e.g. Gasonics, Inc. or Novellus Systems, Inc.).

Figure 2B:
Figure 2C:
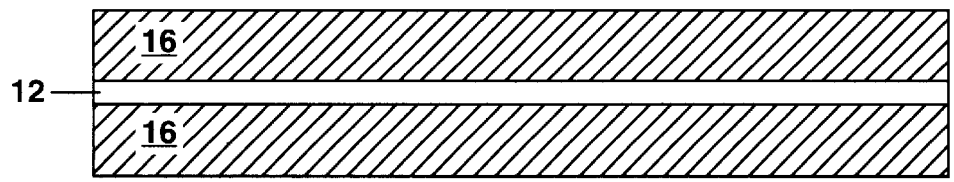
Figure 2D:
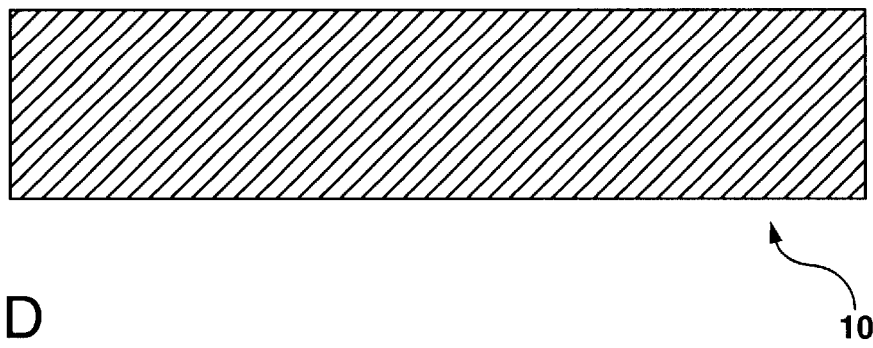

High-pressure oxidation as used according to the present invention involves placing one or more silicon substrates 12 with both major surfaces 14 polished into a wafer carrier, placing the wafer carrier into a chamber of a high-pressure oxidation system, and heating the silicon substrates 12 to an elevated temperature in the range of 700–1200° C. in the presence of an elevated pressure (e.g. 5–50 atmospheres) of an oxidizing ambient (e.g. oxygen, or steam produced from water or from a pyrogenic process whereby hydrogen and oxygen are combined by burning, or a combination of oxygen and steam). Under the above conditions, the silicon substrate 12 is slowly converted into the silica substrate 10 over a period of many hours or days as shown in FIGS. 2B–2D. The oxidation of the silicon substrate 12 begins at each of the two major surfaces 14 which are exposed to the oxidizing ambient and proceeds inward. This oxidation process is the result of a chemical reaction between the oxidizing ambient and the silicon substrate 12 which converts the monocrystalline silicon into silica 16 atom by atom. As the chemical reaction proceeds inward, the oxidizing ambient must diffuse or penetrate through a layer of the silica 16, which grows outward from the silicon substrate 12 as the major surfaces 14 recede inward, to react to react with the silicon substrate material. This outward growth of each layer of the silica 16 results from the increased size of each silica molecule compared to the space occupied by each silicon atom in the monocrystalline silicon substrate 12. As used herein, the term silica refers to an amorphous oxide of silicon $Si_xO_y$ with $x \approx 1$ and with $y \approx 2$, and generally to silicon dioxide ($SiO_2$).

The rate at which the chemical oxidation reaction proceeds depends on both the temperature of the silicon substrate 12 and on the composition and pressure of the oxidizing ambient. Generally, a high substrate temperature of 900–1000° C. and an oxidizing ambient comprising steam at a total pressure of 10–25 atmospheres or more is preferred when using a conventional high-pressure oxidation system subject to limitations of the particular high-pressure oxidation system used.

By simultaneously oxidizing inward from both major surfaces 14 of the silicon substrate 12 according to the present invention, the silica substrate 10 can be formed at least twice as fast compared to oxidizing inward from a single major surface 14 of the silicon substrate 12. The exact time required for formation of the silica substrate 10, which can be learned from practice of the present invention, will depend upon the thickness of the starting silicon substrate 12, the temperature to which the substrate 12 is heated, and the composition and pressure of the oxidizing ambient. When using a wet oxidizing ambient comprising steam, the formation time of the silica substrate 10 is reduced by at least an order of magnitude compared to the use of a dry oxidizing ambient comprising oxygen alone at the same temperature and pressure. Nonetheless, it can take about a day to completely convert a 10-$\mu$m-thick silicon substrate 12 into a silica substrate 10 using an oxidizing ambient comprising steam at an elevated temperature of 900–1000° C. and at an elevated pressure of 25 atmospheres. Up to several days can be required to oxidize completely through a 50-$\mu$m-thick monocrystalline silicon substrate 12 to form a silica substrate 10 as shown in FIGS. 2A–2D.

FIGS. 3A–3E schematically illustrate how a portion 12' of the silicon substrate 12 can be defined and subsequently oxidized to convert the monocrystalline silicon portion 12' into a silica portion 20. The formation of a silica portion 20 according to the present invention has applications, for example, for forming a window through the silicon substrate 12 through which visible light can be transmitted. Examples of applications wherein a silica portion 20 in a monocrystalline silicon substrate 12 are useful include packaging of semiconductor or microfluidic devices wherein the silica portion 20 is used as a lid having a window for optical access to a packaged semiconductor device, or as a window into a channel or cavity for optical analysis of particular chemical species in a fluid located therein.

Figure 3A:
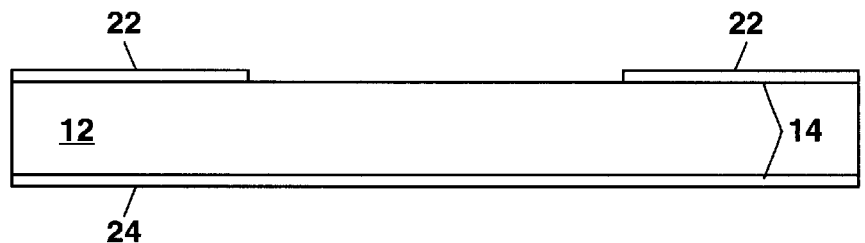
FIGS. 3A–3E schematically illustrate in cross-section view how a portion of a monocrystalline silicon substrate can be converted into silica according to the present invention.
Figure 3B:
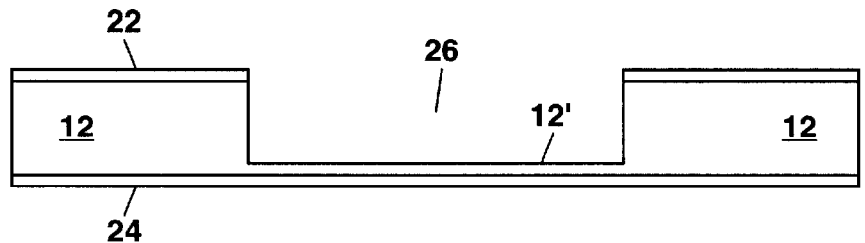

In FIG. 3A, a patterned mask 22 can be photolithographically formed over one of the major surfaces 14 of the silicon substrate 12; and an optional full-surface mask 24 can be formed over the other major surface 14. Each mask 22 and 24 can comprise, for example, a layer of silicon nitride up to a few microns thick deposited by low-pressure chemical vapor deposition (LPCVD) and patterned by anisotropic plasma etching (e.g. reactive ion etching). A portion of the major surface 14 not protected by the patterned mask 22 can then be etched to locally thin the silicon substrate 12 as shown in FIG. 3B.

The etching can be performed using a deep reactive ion etching process which combines multiple anisotropic plasma etching steps with steps for simultaneously depositing an isotropic polymer/inhibitor to minimize lateral etching as disclosed in U.S. Pat. No. 5,501,893 to Laermer et al., which is incorporated herein by reference. Use of this deep reactive ion etching process produces an etched portion 12' at the bottom of a cavity 26 having substantially vertical sidewalls as shown in FIG. 3B. Alternately, the etching can be performed using an anisotropic wet etchant such as potassium hydroxide, tetramethyl ammonium hydroxide or ethylenediamine pyrocatechol. In some instances, these two etching processes can be combined, with the plasma etching initially forming the cavity 26, and with the anisotropic wet etchant being used to form a smooth bottom surface for the cavity 26 (i.e. a smooth upper surface of the portion 12').

Figure 3C:
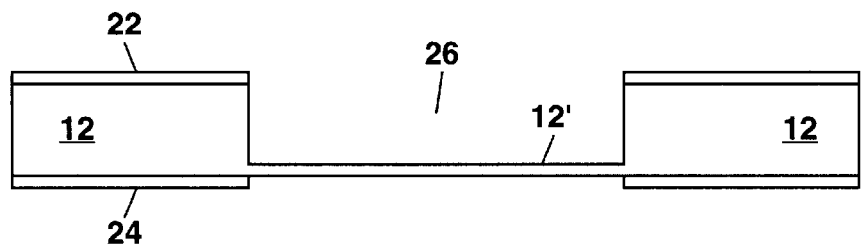

In FIG. 3C, an opening can be formed through the full-surface mask 24 (e.g. by reactive ion etching) and superposed with the opening in the patterned mask 22 so that the bottom of the portion 12' is exposed in preparation for oxidation thereof. Alternately, if no full-surface mask 24 was used in FIGS. 3A and 3B, a patterned mask (e.g. comprising silicon nitride) can be formed on the underside of the substrate 12 with an opening to expose the major surface 14 of the substrate 12 underneath the portion 12'.

Figure 3D:
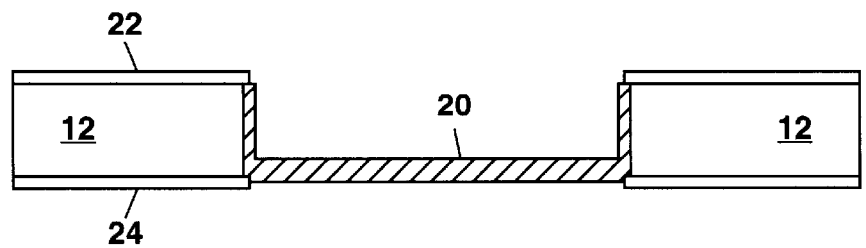
Figure 3E:
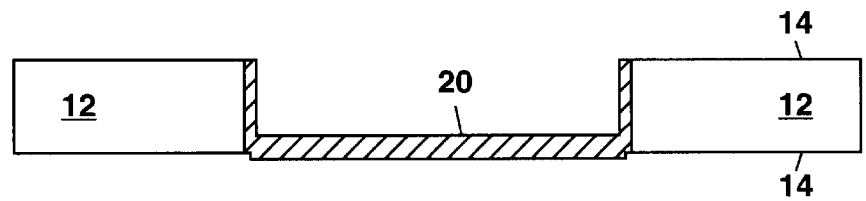

In FIG. 3D, the oxidation step is carried out as previously described with reference to FIGS. 2A–2D, so that each surface of the portion 12' is simultaneously oxidized inward and converted to silica to form the silica portion 20. The oxidation reaction also penetrates laterally into the sidewalls of the cavity 26 as shown in FIG. 3D, although at a smaller rate since the oxidation proceeds from a single direction. The lateral oxidation of the sidewalls can be prevented by masking the sidewalls with a deposited layer of silicon nitride (e.g. a conformal deposition of silicon nitride by LPCVD followed by removing the silicon nitride from the portion 12' by anisotropic plasma etching). In FIG. 3E, the masks 22 and 24 are removed to form the completed silicon substrate 12 with the integral silica portion 20.

In FIGS. 3C and 3D, the silicon portion 12' being converted into the silica portion 20 can be a small fraction of the thickness of the remainder of the silicon substrate 12 so that the oxidation step proceeds much faster than if the entire thickness of the silicon substrate 12 were to be oxidized and converted to silica. This local thinning of the substrate 12 to form the silicon portion 12' can allow the use of a substrate 12 which is much thicker than might otherwise be possible (e.g. several hundred microns thick with the portion 12' being thinned to 10–50 $\mu$m thick, for example). Additionally, the thinner silicon portion 12' helps to accommodate stress produced as a result of an approximately 2:1 expansion of the thickness of the silica portion 20 compared to the thickness of the silicon portion 12'.

Other applications and variations of the present invention will become evident to those skilled in the art. For example, monocrystalline silicon substrates having thicknesses less than 10 $\mu$m or greater than 50 $\mu$m can also be converted to silica substrates, if this is needed for particular applications. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A method for forming an inclusion-free silica substrate, comprising steps for:

(a) providing a monocrystalline silicon substrate; and (b) forming the silica substrate from the silicon substrate by heating the silicon substrate to an elevated temperature and contacting both major surfaces of the silicon substrate with an elevated pressure of an oxidizing ambient, thereby thermally oxidizing the entire silicon substrate.

2. The method of claim 1 wherein the monocrystalline silicon substrate has a thickness in the range of 10–50 microns.

3. The method of claim 1 wherein the elevated temperature is in the range of 700–1200° C.

4. The method of claim 3 wherein the elevated temperature is in the range of 900–1000° C.

5. The method of claim 1 wherein the elevated pressure is in the range of 5–50 atmospheres.

6. The method of claim 5 wherein the elevated pressure is in the range of 10–25 atmospheres.

7. The method of claim 1 wherein the oxidizing ambient comprises oxygen, steam or both oxygen and steam.

8. A method for forming a silica substrate, comprising steps for:

(a) providing a monocrystalline silicon substrate;

(b) heating the silicon substrate to an elevated temperature in the range of 700–1200° C.; and (c) contacting two major surfaces of the heated silicon substrate with an oxidizing ambient at an elevated pressure in the range of 5–50 atmospheres for sufficient time to convert the entirety of the silicon substrate into silica.

9. The method of claim 8 wherein the silicon substrate has a thickness in the range of 10–50 microns.

10. The method of claim 8 wherein the step for heating the silicon substrate comprises heating the silicon substrate to an elevated temperature in the range of 900–1000° C.

11. The method of claim 8 wherein the oxidizing ambient comprises oxygen, steam or a combination thereof.

12. The method of claim 8 wherein the step for contacting the two major surfaces of the heated silicon substrate with the oxidizing ambient comprises contacting the two major surfaces of the heated silicon substrate with the oxidizing ambient at an elevated pressure in the range of 10–25 atmospheres.

13. A method for converting at least a portion of a monocrystalline silicon substrate into silica, comprising steps for:

(a) heating the silicon substrate to an elevated temperature in the range of 700–1200° C.; and (b) contacting a pair of opposing surfaces of the monocrystalline silicon portion with an oxidizing ambient at an elevated pressure in the range of 5–50 atmospheres for sufficient time to convert the entire thickness of the monocrystalline silicon portion into silica.

14. The method of claim 13 wherein the monocrystalline silicon portion is defined by a step for forming a mask over each major surface of the silicon substrate.

15. The method of claim 14 wherein the mask comprises silicon nitride.

\* \* \* \* \*